United States Patent
Hu et al.

(10) Patent No.: US 9,401,263 B2
(45) Date of Patent: Jul. 26, 2016

(54) FEATURE ETCHING USING VARYING SUPPLY OF POWER PULSES

(71) Applicant: GLOBALFOUNDRIES Inc., Grand Cayman (KY)

(72) Inventors: Xiang Hu, Clifton Park, NY (US); Gabriel Padron Wells, Saratoga Springs, NY (US); Jack Chao-Hsu Chang, Clifton Park, NY (US); Mingmei Wang, Clifton Park, NY (US); Taejoon Han, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 174 days.

(21) Appl. No.: 14/031,563

(22) Filed: Sep. 19, 2013

(65) Prior Publication Data

US 2015/0076111 A1    Mar. 19, 2015

(51) Int. Cl.
*H01J 37/32* (2006.01)
*H01L 21/3065* (2006.01)
*H01L 21/3213* (2006.01)

(52) U.S. Cl.
CPC ..... *H01J 37/32146* (2013.01); *H01J 37/32174* (2013.01); *H01L 21/3065* (2013.01); *H01L 21/32137* (2013.01); *H01J 2237/3341* (2013.01); *H01J 2237/3348* (2013.01)

(58) Field of Classification Search
None
See application file for complete search history.

(56) References Cited

U.S. PATENT DOCUMENTS

| | | | | |
|---|---|---|---|---|
| 4,357,195 A * | 11/1982 | Gorin | ............ | 156/345.28 |
| 5,614,060 A * | 3/1997 | Hanawa | ............ | 438/720 |
| 5,859,501 A * | 1/1999 | Chi | ............ | 315/111.21 |
| 5,964,949 A * | 10/1999 | Savas | ............ | 118/723 I |
| 6,110,287 A * | 8/2000 | Arai et al. | ............ | 156/345.34 |
| 6,255,221 B1 * | 7/2001 | Hudson et al. | ............ | 438/710 |
| 6,261,962 B1 * | 7/2001 | Bhardwaj | ......... | H01L 21/30655 257/E21.235 |
| 6,351,683 B1 * | 2/2002 | Johnson et al. | ............ | 700/121 |
| 6,472,822 B1 * | 10/2002 | Chen et al. | ............ | 315/111.21 |
| 6,562,190 B1 * | 5/2003 | Kuthi et al. | ............ | 156/345.44 |
| 6,589,437 B1 * | 7/2003 | Collins | ............ | 216/68 |
| 6,756,311 B2 * | 6/2004 | Suzuki | ............ | 438/706 |
| 6,759,339 B1 * | 7/2004 | Choi et al. | ............ | 438/710 |
| 6,767,838 B1 * | 7/2004 | Ono et al. | ............ | 438/720 |
| 6,849,191 B2 * | 2/2005 | Ono et al. | ............ | 216/61 |
| 6,926,844 B1 * | 8/2005 | Laermer et al. | ............ | 216/67 |
| 7,059,267 B2 * | 6/2006 | Hedberg | ......... | H01J 37/32623 118/723 E |
| 7,115,185 B1 * | 10/2006 | Gonzalez et al. | ............ | 156/345.44 |
| 8,021,723 B2 * | 9/2011 | Fukasawa et al. | ............ | 427/569 |
| 8,659,335 B2 * | 2/2014 | Nagarkatti et al. | ............ | 327/181 |
| 8,703,002 B2 * | 4/2014 | Matsudo et al. | ............ | 216/67 |
| 8,753,527 B2 * | 6/2014 | Nishizuka | ......... | H01J 37/32192 156/345.28 |
| 8,883,028 B2 * | 11/2014 | Kanarik | ............ | 216/68 |
| 2001/0025606 A1 * | 10/2001 | Ichijo | ............ | 118/723 E |
| 2002/0033233 A1 * | 3/2002 | Savas | ............ | 156/345.48 |

(Continued)

*Primary Examiner* — Allan Olsen
(74) *Attorney, Agent, or Firm* — Heslin Rothenberg Farley & Mesiti P.C.; Kristian Ziegler

(57) ABSTRACT

Etching a feature of a structure by an etch system is facilitated by varying supply of radio frequency (RF) power pulses to the etch system. The varying provides at least one RF power pulse, of the supplied RF power pulses, that deviates from one or more other RF power pulses, of the supplied RF power pulses, by at least one characteristic.

20 Claims, 7 Drawing Sheets

(56) References Cited

U.S. PATENT DOCUMENTS

| | | | |
|---|---|---|---|
| 2002/0139658 A1* | 10/2002 | Kanakasabapathy et al. | 204/164 |
| 2002/0160125 A1* | 10/2002 | Johnson et al. | 427/569 |
| 2003/0151372 A1* | 8/2003 | Tsuchiya et al. | 315/111.81 |
| 2004/0242021 A1* | 12/2004 | Kraus et al. | 438/776 |
| 2005/0241762 A1* | 11/2005 | Paterson et al. | 156/345.28 |
| 2006/0113277 A1* | 6/2006 | Krawczyk | B41J 2/1433 216/2 |
| 2007/0264791 A1* | 11/2007 | Han et al. | 438/424 |
| 2008/0023440 A1* | 1/2008 | Chen et al. | 216/58 |
| 2008/0110859 A1* | 5/2008 | Koshiishi et al. | 216/67 |
| 2010/0278368 A1* | 11/2010 | Martin et al. | 381/340 |
| 2011/0032047 A1* | 2/2011 | Yuzurihara et al. | 332/108 |
| 2012/0161327 A1* | 6/2012 | Chumakov | H01L 21/76804 257/773 |
| 2012/0217221 A1* | 8/2012 | Hoffman et al. | 216/61 |
| 2014/0302682 A1* | 10/2014 | Muto et al. | 438/711 |
| 2014/0305905 A1* | 10/2014 | Yamada et al. | 216/71 |
| 2014/0361690 A1* | 12/2014 | Yamada et al. | 315/111.21 |
| 2015/0000841 A1* | 1/2015 | Yamada et al. | 156/345.28 |

* cited by examiner

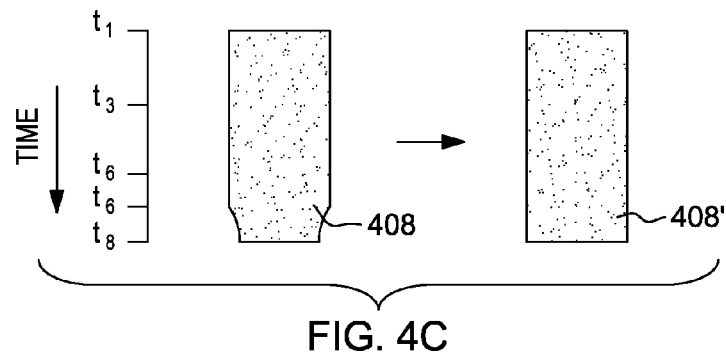
FIG. 4C
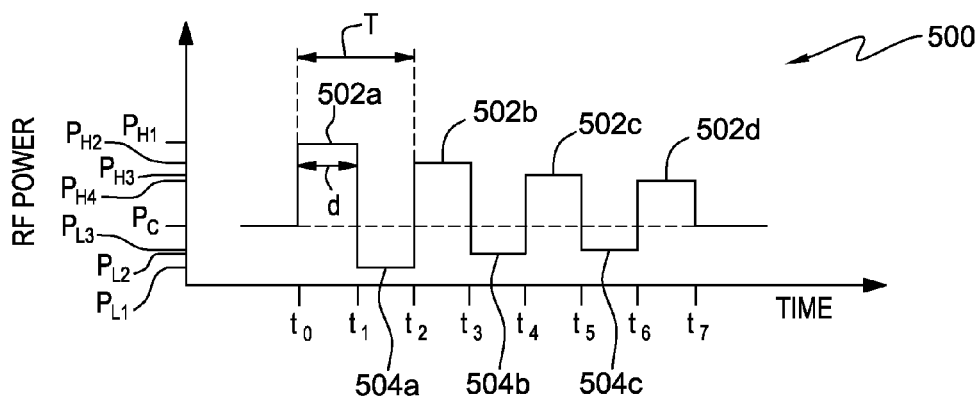
FIG. 5A
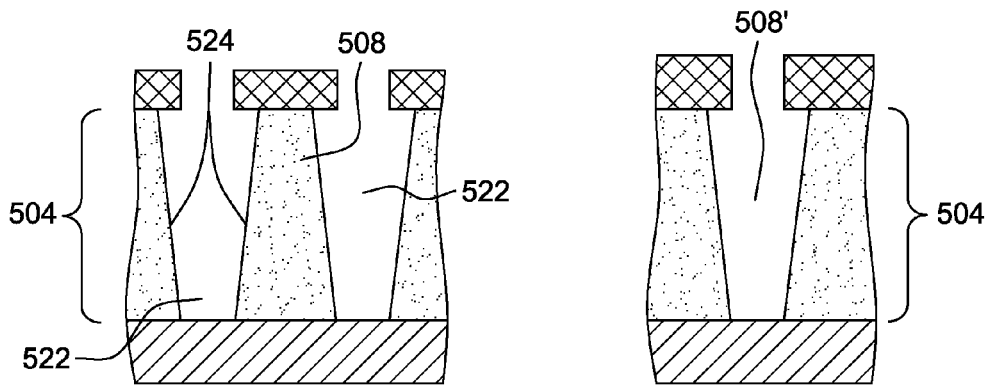
FIG. 5B
FIG. 5C

FEATURE ETCHING USING VARYING SUPPLY OF POWER PULSES

BACKGROUND

Various etch systems to etch features of structures utilize a supply of power to an energy discharge system to drive the etching. In Reactive Ion Etching (RIE), for instance, a power source supplies power to drive etching by a chemically reactive plasma, in which ions are accelerated toward the surface of a structure to be etched. The anisotropic nature of RIE provides generally a more directed etch than its isotropic counterparts (such as wet etching techniques), but undesirable characteristics in the features etched by RIE can still manifest themselves. When sidewall passivation and the supply of power to activate the plasma ion bombardment are not calibrated to each other, for instance, excessive etching and jagged or rough sidewalls (termed 'faceting') of the etch trench can result.

BRIEF SUMMARY

The shortcomings of the prior art are overcome and additional advantages are provided through the provision of a method that includes: facilitating etching a feature of a structure by an etch system, the facilitating including: varying supply of radio frequency (RF) power pulses to the etch system, the varying providing at least one RF power pulse, of the supplied RF power pulses, that deviates from one or more other RF power pulses, of the supplied RF power pulses, by at least one characteristic.

In a further aspect, a system is provided that includes a controller to facilitate etching a feature of a structure by an etch system, the controller facilitating etching a feature of a structure by an etch system, the facilitating including: varying supply of radio frequency (RF) power pulses to the etch system, the varying providing at least one RF power pulse, of the supplied RF power pulses, that deviates from one or more other RF power pulses, of the supplied RF power pulses, by at least one characteristic.

In yet a further aspect, a computer program product is provided that includes a computer readable storage medium storing program instructions readable by a processor for execution to perform a method including: facilitating etching a feature of a structure by an etch system, the facilitating including: varying supply of radio frequency (RF) power pulses to the etch system, the varying providing at least one RF power pulse, of the supplied RF power pulses, that deviates from one or more other RF power pulses, of the supplied RF power pulses, by at least one characteristic.

Additional features and advantages are realized through the concepts of the present invention. Other embodiments and aspects of the invention are described in detail herein and are considered a part of the claimed invention.

BRIEF DESCRIPTION OF THE DRAWINGS

Aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4C illustrates a comparison between an etched feature produced using the conventional RF power pulse schedule of FIG. 2 versus an etched feature produced using the varied RF power pulse schedule of FIG. 4B, in accordance with aspects described herein;

FIG. 5A depicts another example of a varied RF power pulse schedule, in which supply of RF power pulses to an etch system is varied in order to etch the features depicted in FIGS. 5B and 5C, in accordance with aspects described herein;

FIGS. 5B and 5C depict example features etched by the varied RF power pulse schedule of FIG. 5A, in accordance with aspects described herein;

DETAILED DESCRIPTION

Figure 1:
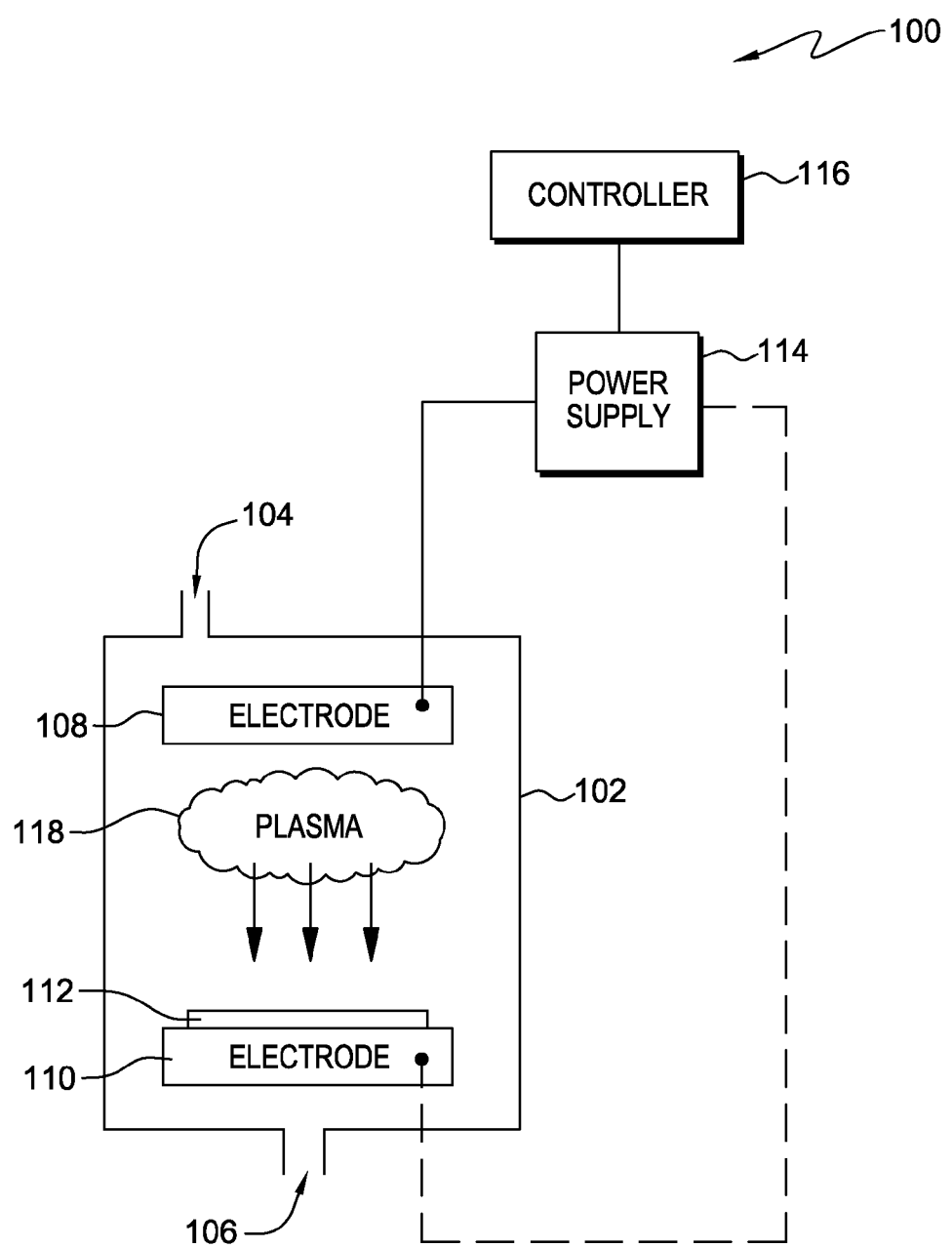
FIG. 1 depicts an example etch system to incorporate and use aspects described herein.

FIG. 1 depicts an example etch system to incorporate and use aspects described herein. In the example of FIG. 1, the etch system is a parallel plate Reactive Ion Etching (RIE) etch system, though aspects described herein apply to other types of etch systems/technologies.

Referring to FIG. 1, etch system 100 includes an etch chamber 102 (also termed a reactor) having a gas inlet 104 and pump outlet 106. Gas enters chamber 102 through gas inlet 104 and exits through vacuum pump outlet 106, with the chamber being maintained with a controlled gas volume and pressure. Upper electrode 108 and lower electrode 110 are spaced apart within chamber 102, and a structure 112 to be etched, such as a silicon or polysilicon wafer, sits atop electrode 110.

In operation, a power supply 114 controlled by a controller 116 provides radio frequency (RF) power pulses to upper electrode 108 and/or lower electrode 110. This creates an oscillating electronic field that ionizes gas molecules, creating a plasma cloud 118. The electric field created between the two electrodes causes negative ions to accelerate toward, and collide with, structure 112 reacting both chemically and physically (sputtering). The reactions etch the structure substantially anisotropically (unidirectionally) in the direction of the field between the two electrodes (indicated by the arrows in FIG. 1). In many applications, photoresist in the form of a mask is placed on top of the structure to be etched, enabling selective exposure of only those areas of the structure that are desired to be etched.

In one specific example, the gas is sulfur hexafluoride for etching a silicon or polysilicon wafer, in which fluorine ions of the plasma cloud are accelerated toward, and collide with, the surface of the wafer to anisotropically etch the wafer.

Figure 2:
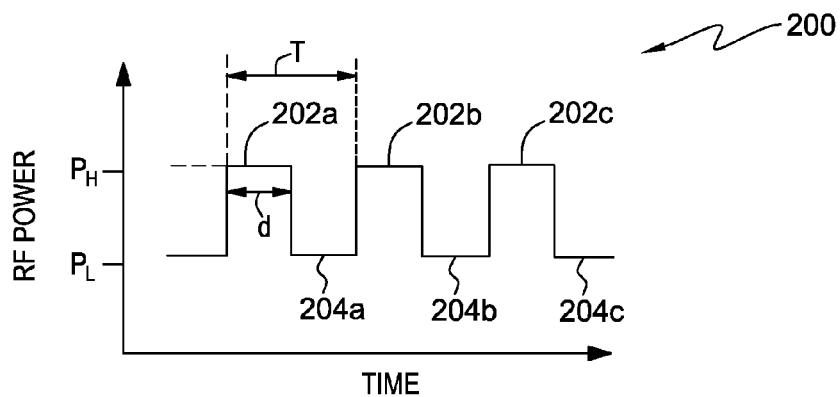
FIG. 2 depicts a conventional radio-frequency (RF) power pulse schedule.

Controller 116 controls output of power from power supply 114 in the form of RF power pulses from power supply 114 to electrode(s) of the etch system. A conventional RF power pulse schedule is depicted in FIG. 2. The power pulse schedule of FIG. 2 is in the form of a power wave 200, which resembles a square wave type of periodic waveform. Power wave 200 fluctuates between high and low RF power levels ($P_H$ and $P_L$, respectively) over time. In the conventional RF power pulse schedule, pulses are supplied at a constant period T (referred to as power pulse cycle time) which is the duration of time between consecutive power pulses. A high RF power is supplied for a duration of time, d, followed by a low RF power for a duration of time (T-d).

A power pulse is a spike in RF power from a lower RF power level to a higher RF power level, forming a peak followed by some period of lower RF power (a trough). Power wave 200 of FIG. 2 includes peaks 202a, 202b, 202c, and troughs 204a, 204b, 204c. Each pulse in FIG. 2 has a peak power level of $P_H$ and a trough power level of $P_L$. The power pulse duration is the length of time spent at the high (peak) power level. It is noted that in some embodiments $P_L$ is 0 W or approximately 0 W, while in others, $P_L$ is greater than 0 W. Also, in these examples, power levels are given in Watts, though it is understood that power levels for etch systems or components thereof (such as the lower electrode) may instead be measured in volts (V).

It is seen that RF power pulses have characteristics, such as the power pulse duration, the period of time between pulses (power pulse cycle time), and the RF power levels $P_H$ and $P_L$. In conventional RF power pulsing, the power levels and the timing of the provided pulses are not varied, as depicted in FIG. 2. The power pulse cycle time (T) is constant, and each pulse has the same characteristics—the peak power duration (d) and trough power duration (T-d) are the same, as are each peak power level ($P_H$) and trough power level ($P_L$).

Figure 3A:
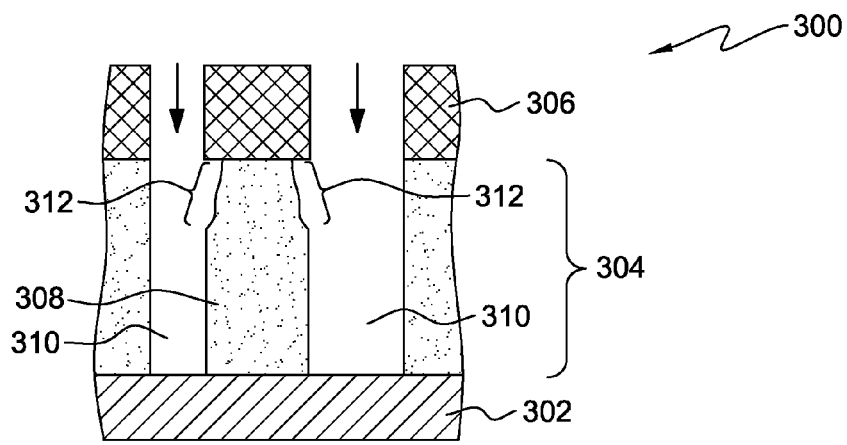
FIG. 3A illustrates an example of faceting that can occur using the conventional RF power pulse schedule of FIG. 2.

Instead of supplying continuous power to the etch system, power pulsing such as depicted in FIG. 2 is used to drive the ion movement to perform the etching. The unvarying nature of conventional power pulsing can be too simplistic for requirements of state of the art (and future) processes. In addition, unvarying RF power pulsing and constant duty cycle may not provide a flexible control strategy to meet some present challenges. One such challenge is faceting/notching that can occur when using a conventional RF power pulse schedule. FIG. 3A illustrates one example of such faceting that can occur when using the conventional RF power pulse schedule of FIG. 2.

In FIG. 3A, a cross section is presented of a portion of an etched structure 300. The structure may, in some embodiments, be an intermediate structure in the formation of an integrated circuit ("chip"). The structure includes a substrate 302 having disposed thereon a layer of material 304, such as a polysilicon material. Disposed on top of material 304 is a photoresist 306.

In FIG. 3A, feature 308 is formed by etching anisotropically to form trenches 310. When RF power is supplied to the discharge system, the excited ions travel in the direction of the arrows and through spaces in photoresist 306, bombarding material 310 to etch downward (in this example) through material 304 toward substrate 302. The more time spent pulsing to etch downward, the deeper trenches 310 become. As trenches 310 are etched to form feature 308, surfaces of trenches 310 passivate (e.g. during period of low or no RF power). Ideally, the sidewalls of each trench will passivate sufficiently such that they withstand the etching power of any stray ions reflecting within the trench and striking the sidewalls. Meanwhile, by the number and speed of ions directed at the bottom of the trench, etching will continue in the downward (in this example) direction with subsequent power pulses, overcoming any passivation that has built up at the bottom of the trench.

What is desired in some applications is a substantially flat and uniformly sloped sidewall of the trenches, that is, one that exhibits little or no undesirable faceting or 'scalloping'. In FIG. 3A, the conventional RF power pulse scheme has resulted in the faceting indicated by 312. Faceting may occur for any number of reasons under varying circumstances. In some examples, it is based on the materials being used or the stoichiometry among the materials. In one example, the etching consumed the bottom edges of the photoresist, exposing the upper corners of the feature 308 being etched and leaving the corners unprotected and unable to sufficiently passivate to protect against further etching thereof.

The etch process can be a complicated process that involves etch and passivation. In accordance with aspects described herein, the balance between etch and passivation may be controlled to achieve different process purposes (etch profiles). A variety of process parameters are available, including process chemistry, process pressure, power, time, etc. to modulate this balance to etch the front and sidewalls.

According to aspects described herein, methods are described for varying supply of RF power pulses, i.e. to control the provision of RF power pulses to have varying characteristics. The ability to control characteristics of the supplied RF power pulses provides a non-conventional tuning parameter to achieve real-time control over etch profiles for the etched features. Aspects described herein effectively modulate sidewall polymer passivation stoichiometry via discrete and dynamic control of RF power pulses delivered to the etch system or component thereof. Control over the characteristics of the supplied RF power pulses affects the generation rate as well as the ratio of critical etching and polymerizing species. The amount of sidewall polymer passivation during reactive ion etches is thereby instantaneously modulated by the aforementioned ratio. That is, the passivation amount on the sidewalls of the etch trench can be controlled by turning on or off the plasma reaction (i.e. controlling RF power pulsing). In one example, with more power and longer "plasma on" time, more polymer will be generated to passivate on the sidewall. The more passivation generated, the less the lateral (horizontal in the figures) etch amount will be. Thus, dynamic sidewall passivation balance will influence the effective lateral etch rate during the treatment (etch process). This facilitates control over anisotropic etching across a wide range of materials, which in many application are arranged in complex, multiple-layered structures to be etched. Dynamically modulating the effective degree of sidewall polymer passivation in real time may achieve different levels of lateral etch rates. In turn, structural architecture of etch features may be more precisely controlled during the etch process. Control over surface chemistry dynamics provides flexibility to enable the advancement of semiconductor processing methods and techniques. For instance, process engineers or other users can exploit high selectivity schemes during RIE processing that would otherwise remain out of reach with conventional or traditional RIE methods. Selectivity refers to the ratio of the etch rate of one material over that of another material.

Accordingly, control over the RF power delivered to the discharge system, and the characteristics of the pulses to deliver that power, is achieved via dynamic RF power pulsing strategies. In some examples, the total amount of RF power delivered over a length of time, such as the time to etch the feature, is greater or lesser as compared to the total amount of RF power delivers by the conventional schedule. In other examples, the same total amount of RF power is delivered, but using varied RF power pulsing as described herein. Further, in some examples, the average input power ($P_{AVG}$) is altered via the dynamic modulation of peak power level ($P_{MAX}$), trough power level ($P_{MIN}$), and/or effective duty cycle γ, to be greater or lesser than average input power of the conventional power pulsing schedule, while in other examples, average input power is the same as the conventional power pulsing schedule. $P_{AVG}$ is given by the equation:

$$P_{AVG} = P_{MAX} \times \gamma = P_{MAX}\left(\frac{\tau_{ON}}{\tau_{ON} + \tau_{OFF}}\right),$$

where $\tau_{ON}$ and $\tau_{OFF}$ represent the on and off times during pulsing (on corresponds to high power level and low corresponds to low power level).

Figure 3B:
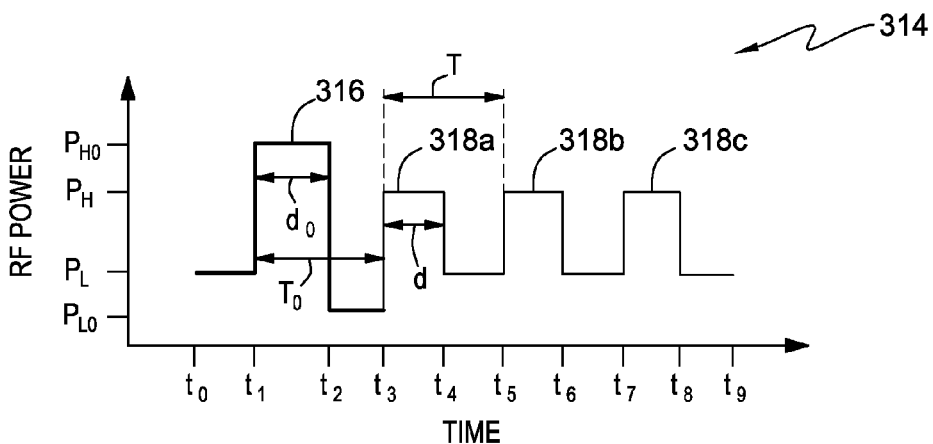
FIG. 3B illustrates an example of a varied RF power pulse schedule, in which supply of RF power pulses to an etch system is varied in order to avoid the faceting of FIG. 3A, in accordance with aspects described herein.
Figure 3C:
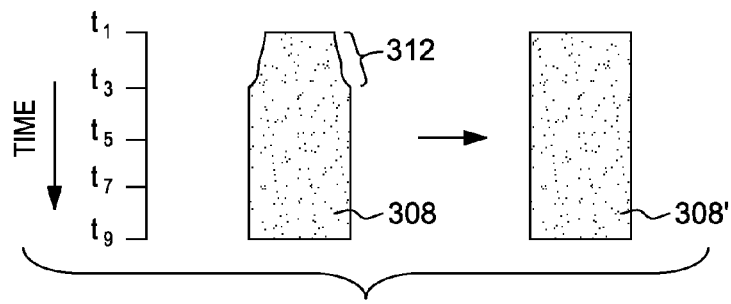
FIG. 3C illustrates a comparison between an etched feature produced using the conventional RF power pulse schedule of FIG. 2 versus an etched feature produced using the varied RF power pulse schedule of FIG. 3B, in accordance with aspects described herein.

FIGS. 3B and 3C illustrate how varied supply of RF power pulses can control the etch process to generate a very specific profile of the desired feature. FIG. 3B illustrates an example of a varied RF power pulse schedule, in which supply of RF power pulses to an etch system is varied in order to avoid the faceting of FIG. 3A, in accordance with aspects described herein. In FIG. 3A, the top corners of the etched feature indicate a passivation problem in that region (312). The RF power pulse schedule of FIG. 3B addresses this by supplying an initial RF power pulse having more extreme fluctuation in peak and trough power levels, and having a duration at peak power level (power pulse duration) that is longer than that of the rest of the supplied pulses. This is illustrated by the bold portion of power wave 314 in FIG. 3B. Initially, starting from $t_0$, the RF power level is $P_L$, the normal trough power level to supply to the discharge system. With first power pulse 316 beginning at $t_1$, the peak power level is $P_{H0}$ and the trough power level is $P_{L0}$. Peak power level $P_{H0}$ is a greater power level than $P_H$, the peak power level for the remaining pulses 318a-318c, and trough power level $P_{L0}$ is a lesser power level than $P_L$, the trough power level of the remaining pulses 318a-318c. Furthermore, power pulse duration $d_0$ at peak power level (between times $t_1$ and $t_2$) for pulse 316 is longer than power pulse duration d, the power pulse duration for remaining power pulses 318a-318c. In some examples, period $T_0$ may be the same as period T, or different from period T. It is seen that the first RF power pulse (316) deviates from the remaining RF power pulses in this example by these three characteristics—peak power level, trough power level, and power pulse duration.

For this example power pulse schedule of FIG. 3B, as the etch proceeds down through material 304 from top to bottom (corresponding to passage in time), the longer power pulse in the beginning of the etch, having the higher peak power level, provides a more powerful and longer (in duration) etch exposure to the top portion of the layer being etched. By doing this, more passivation (as compared to the conventional etch schedule) is generated at the beginning of the etch (times $t_1$ to $t_3$), which helps protect the upper portions of the created trench/feature (308) sidewalls.

FIG. 3C illustrates a comparison between an etched feature produced using the conventional RF power pulse schedule of FIG. 2 versus an etched feature produced using the varied RF power pulse schedule of FIG. 3B, in accordance with aspects described herein. The time schedule on the left of FIG. 3C correlates to the timing as seen in FIG. 3B. As explained above, the etching process etches downward (in these examples) through material 304 from top to bottom with supply of RF power pulses over the period of time. In FIG. 3C, by supplying the varied RF power pulse between times $t_1$ and $t_3$, faceting 312 of feature 308 is eliminated, as shown in 308'.

Figure 4A:
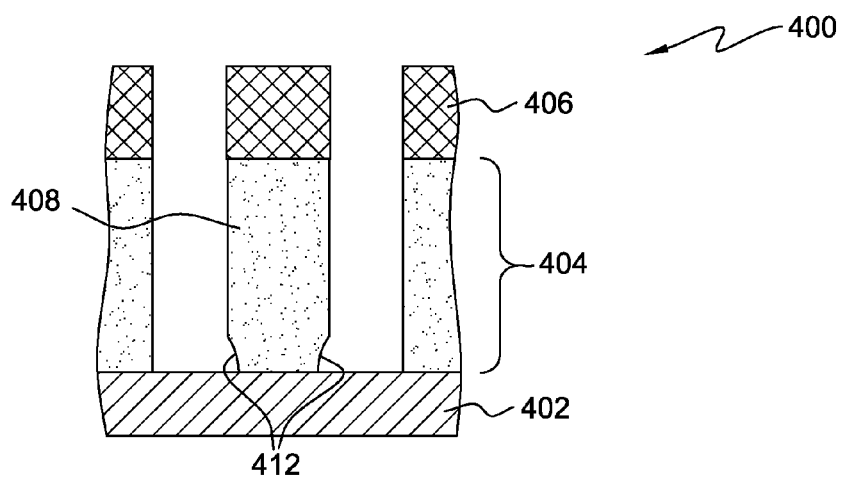
FIG. 4A illustrates another example of notching that can occur using the conventional RF power pulse schedule of FIG. 2.

FIG. 4A illustrates another example of notching that can occur using the conventional RF power pulse schedule of FIG. 2. In FIG. 4A, structure 400 includes substrate 402 having a layer of material 404 to be etched and a photoresist mask 406. Under the conventional RF power pulsing schedule, feature 408 exhibits notching 412 at the lower corners. Again, the notching may be a product of deviations in passivation. Sometimes toward the end of an etch process, upon reaching the underling substrate, ions reflect off of the bottom of the trench and the reflections can cause notching 412 at the bottom of the sides of the feature being etched. In other examples, reaction material for causing the desired passivation may have been consumed by the end of the etch process, hindering further passivation and resulting in excessive etching at the bottom of the trench, leading to the notching depicted in FIG. 4A.

Figure 4B:
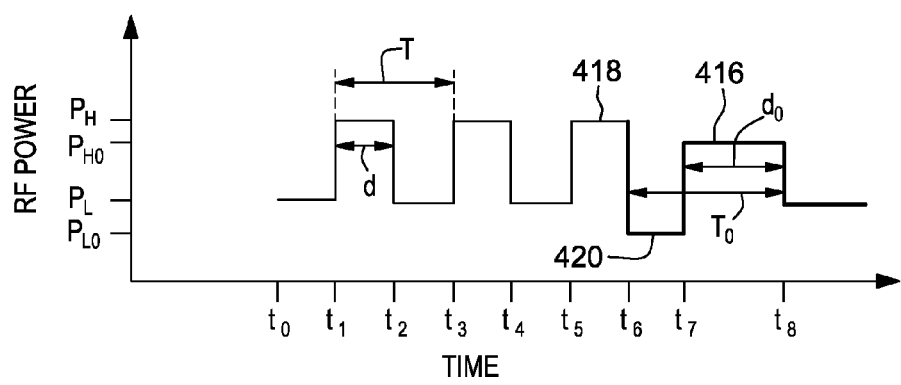
FIG. 4B illustrates an example of a varied RF power pulse schedule, in which supply of RF power pulses to an etch system is varied in order to avoid the notching of FIG. 4A, in accordance with aspects described herein.

FIG. 4B illustrates an example of a varied RF power pulse schedule, in notching of FIG. 4A, in accordance with aspects described herein. Up to time $t_6$, the RF power pulse schedule follows the conventional pulse schedule varying between $P_L$ and $P_H$, at period T with peak pulse duration of d. At $t_6$, trough (420) power level dips to $P_{L0}$, which is lower than $P_L$. The following pulse 416 peaks at power level $P_{H0}$, which is lower than $P_H$. However, power pulse duration of pulse 416 is extended to $d_0$, a longer duration than the duration d of the other pulses. As a result, the power pulse schedule has a modulated period $T_0$ (between times $t_6$ and $t_8$) at the end of the etch process. Thus, to overcome the notching seen in FIG. 4A, a lower peak power level (resulting in a slower etch rate) is supplied for a longer period of time.

FIG. 4C illustrates a comparison between an etched feature produced using the conventional RF power pulse schedule of FIG. 2 versus an etched feature produced using the varied RF power pulse schedule of FIG. 4B, in accordance with aspects described herein. Longer (in duration) but less powerful pulse 416 from FIG. 4B has resulted in a cleaner (little or no notching) etch at the bottom portions of feature 408', versus feature 408 formed by the conventional power pulse schedule.

The examples of FIGS. 3B and 4B show a slightly modified RF power pulse schedule in which a single pulse deviates from the rest of the pulses. However, in some examples, the deviant pulse is repeated, or several distinct deviant pulses are provided in the power pulse schedule. In some examples, peak and/or trough power levels, power pulse duration, power pulse cycle time, etc. are modulated with each pulse of several pulses, so that several consecutive (or non-consecutive) pulses have different characteristics.

FIG. 5A depicts another example of a varied RF power pulse schedule, in which supply of RF power pulses to an etch system is varied in order to etch the features depicted in FIGS. 5B and 5C, in accordance with aspects described herein. In the example power pulse schedule 500 of FIG. 5A, peak power level across several consecutive power pulses decreases. Thus, pulse 502a has a peak power level of $P_{H1}$, pulse 502b has a peak power level of $P_{H2}$, pulse 502c has a peak power level of $P_{H3}$, and pulse 502d has a peak power level of $P_{H4}$, with $P_{H1} > P_{H2} > P_{H3} > P_{H4}$. Also in this example, trough power level across the several consecutive power pulses increases. Trough 504a has a trough power level of $P_{L1}$, trough 504b has a trough power level of $P_{L2}$, and trough 504c has a trough power level of $P_{L3}$, with $P_{L1} < P_{L2} < P_{L3}$. In this example, peak and trough power levels converge to a convergence power level $P_C$.

FIGS. 5B and 5C depict example features etched by the varied RF power pulse schedule of FIG. 5A, in accordance with aspects described herein. As seen in FIG. 5B, feature 508 is formed by etching trenches 522 through material layer 504. The resulting trenches 522 have sloped sidewalls 524, where trench width narrows as the depth of the trench (corresponding to the passage of time during the etch process) increases. The slope is substantially uniform through the depth of the trench. In some examples, the slope of the sidewalls may be controlled to be steeper or gentler by controlling the rate of convergence of the supplied power wave to the convergence power level $P_C$ (FIG. 5A).

In FIG. 5B, feature 508 is formed by etching trenches 522 on both sides of the feature to create a standalone feature that is trapezoidal in shape. FIG. 5C depicts a similar case except that the feature being formed is the trench itself. Thus, feature 508' may be formed using the power pulse schedule depicted in FIG. 5A to etch a single trench (508') into material layer 504.

Figure 5D:
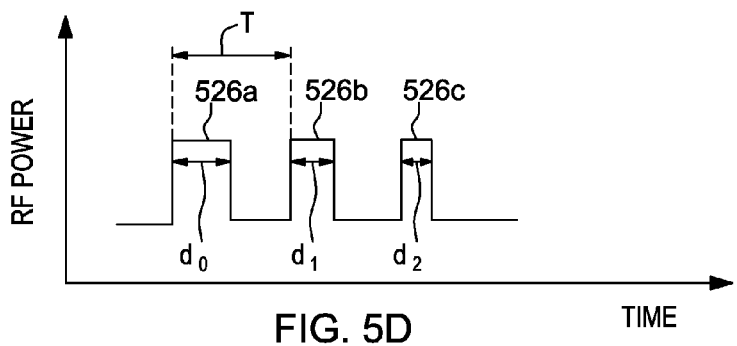
FIG. 5D depicts a further example of a varied RF power pulse schedule, in order to etch the features depicted in FIGS. 5B and 5C, in accordance with aspects described herein.

FIG. 5D depicts a further example of a varied RF power pulse schedule, in order to etch the features depicted in FIGS. 5B and 5C, in accordance with aspects described herein. In FIG. 5D, the percentage of time spent at peak power level versus trough power level (termed 'duty factor') is modulated across consecutive pulses, while power pulse cycle time (period T), peak power levels, and trough power levels all remain constant. More specifically, duty factor is decreasing with passage of time in FIG. 5D. That is, power pulse 526a has a power pulse duration (time spent at peak power level) of $d_0$, while power pulse 526b has power pulse duration of $d_1$ and 526c has a power pulse duration of $d_2$, where $d_1 > d_2 > d_3$. Since period T is constant and power pulse duration decreases across consecutive power pulses, duration of time spent at trough power level necessarily increases across consecutive power pulses.

Figure 6A:
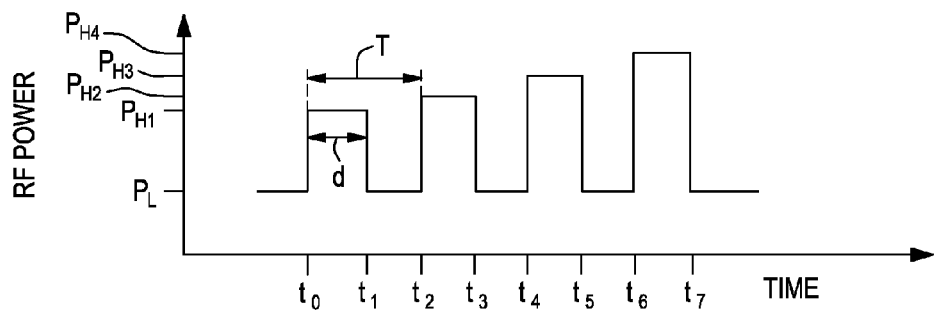
FIG. 6A depicts another example of a varied RF power pulse schedule, in which supply of RF power pulses to an etch system is varied in order to etch the features depicted in FIGS. 6B and 6C, in accordance with aspects described herein.
Figure 6B:
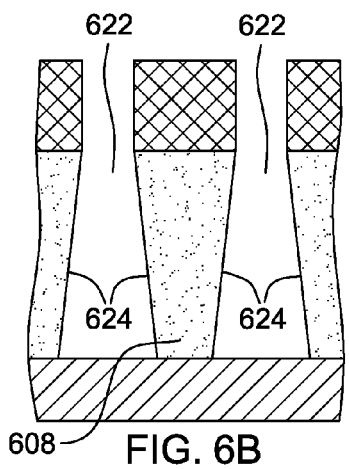
FIGS. 6B and 6C depict example features etched by the varied RF power pulse schedule of FIG. 6A, in accordance with aspects described herein.
Figure 6C:
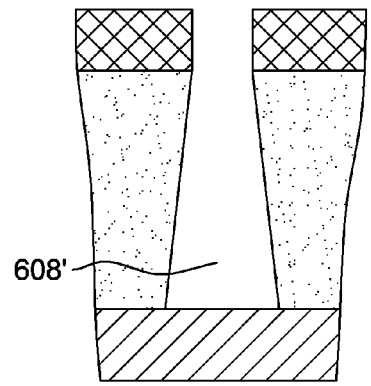

FIG. 6A depicts another example of a varied RF power pulse schedule, in which supply of RF power pulses to an etch system is varied in order to etch the features depicted in FIGS. 6B and 6C, in accordance with aspects described herein. In this example, peak power level across consecutive power pulses increases ($P_{H1} < P_{H2} < P_{H3} < P_{H4}$). The increasing peak power level over time increases aggressiveness of the etch over time. More aggressive etching is performed later in the etch process, resulting in sloped trench sidewalls, with the trench widening as trench depth increases.

FIGS. 6B and 6C depict example features etched by the varied RF power pulse schedule of FIG. 6A, in accordance with aspects described herein. In FIG. 6B, trenches 622 have sloped sidewalls 624, as before, except that the slopes undercut the trench opening so that the trench widens as depth increases. Resulting feature 608 is trapezoidal in shape with a skinnier base than top portion. FIG. 6B depicts a similar case except that the feature 608' being formed is a trench.

In drawing figures provided herewith, power waves are drawn to resemble square waves for illustration purposes only, and it should be appreciated that the transitions between power levels may, in practice, not be as instantaneous as are represented by the waveforms in the figures. In other words, due to varying equipment capabilities and other circumstances, supply of RF power pulses may, in actuality, bear closer resemblance to other kinds of periodic waveform, such as a sine wave, and/or include minor deviations (jagged transitions, insignificant power fluctuations around an average trough or peak power level, etc), from the represented waveforms. Nonetheless, principles described herein in which power pulse characteristics (peak and trough power levels, pulse durations, cycle times, etc.) are modulated are equally applicable to these other kinds of periodic waveforms.

According to aspects described herein, characteristics of RF power pulses are modulated to drive a desired etch profile that can be employed to address problems associated with conventional etching techniques, such as faceting/notching that would otherwise occur if a conventional approach were used. Example characteristics include peak and trough power level, power pulse duration, and power pulse cycle time. Any one or more characteristics can be varied for any one or more power pulses of an RF power pulse schedule. In some examples, varying the characteristics selectively controls the stoichiometry of the etch reactant(s), for instance to modulate levels of sidewall polymer passivation at various points of the etch profile. Enhanced flexibility is provided for both selectively control and etch profile control in an etch process through the variance of power pulse characteristics.

Those having ordinary skill in the art will recognize that aspects of the present invention may be embodied in one or more systems, one or more methods and/or one or more computer program products. In some embodiments, aspects of the present invention may be embodied entirely in hardware, entirely in software (for instance in firmware, resident software, micro-code, etc.), or in a combination of software and hardware aspects that may all generally be referred to herein as a "system" and include circuit(s) and/or module(s).

In one example, aspects described herein are embodied within a data processing system. The data processing system may be a controller (e.g., #116 of FIG. 1) for controlling, directly or indirectly, the supply of RF power pulses to an etch system or component thereof. The controller may be a component of the etch system or may be a standalone system in communication with an etch system or component thereof, as examples. The controller can drive operation of component(s) of the etch system, for instance to control output of RF power pulses from a power supply in order to drive an etch process. In some examples, the data processing system is a microcontroller provided as part of an etch system, having a microprocessor that executes commands. In other examples, the data processing system is a more robust computer, such as is described below with reference to FIG. 8.

Figure 7:
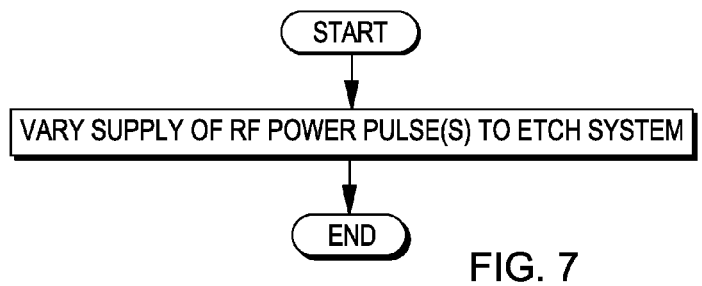
FIG. 7 depicts one example of a process to facilitate etching a feature of a structure by an etch system, in accordance with aspects described herein.

The controller can perform a method, for instance the process of FIG. 7 to facilitate etching a feature of a structure by an etch system, in accordance with aspects described herein. The process includes varying supply of RF power pulses to the etch system. Varying the supply of RF power pulses can provide at least one RF power pulse, of the supplied RF power pulses, that deviates from one or more other RF power pulses of the supplied RF power pulses by at least one characteristic. Example such characteristics are set forth below:

Peak power level: at least one RF power pulse can have a peak power level that is greater or lesser than a peak power level of one or more other RF power pulses. In some examples, varying the supply of RF power pulses includes increasing or decreasing peak power level across two or more consecutive RF power pulses of the supplied RF power pulses.

Trough power level: at least one RF power pulse can have a trough power level that is greater or lesser than a trough power level of one or more other RF power pulses. In some examples, varying the supply of RF power pulses includes increasing or decreasing trough power level across two or more consecutive RF power pulses of the supplied RF power pulses.

Power pulse duration: at least one RF power pulse can have a pulse duration that is longer or shorter than a pulse duration of one or more other RF power pulses. Pulse duration can refer to the duration of time at which the pulse is at peak power level, which could include time at a local maximum power level, or time above a particular power level, as examples. In some examples, varying the supply of RF power pulses includes decreasing or increasing pulse duration across two or more consecutive RF power pulses of the supplied RF power pulses.

Power pulse cycle time: Cycle time between power pulses can vary within a RF power pulse schedule. That is, a duration of time between an RF power pulse and a following RF power pulse may be longer or shorter than a duration of time between another RF power pulse and an RF power pulse following the another RF power pulse.

The varied characteristic can include varying any combination of one or more of the above characteristics, or other characteristics of the RF power pulses. As one example, both power pulse duration and peak power level or trough power level can be varied. As another example, trough power level across two or more consecutive RF power pulses can be increased or decreased, while increasing or decreasing peak power level across the two or more consecutive RF power pulses.

In addition, the varying can supply the at least one RF power pulse (having characteristic(s) varying from those of other supplied RF power pulses) at any desired time during the RF power pulse schedule and with any desired number of repetitions. For instance, the at least one RF power pulse can be supplied at a beginning of etching the feature (prior to supplying the other RF power pulses) or at an end of etching the feature (after supplying the other RF power pulses). The characteristic(s) of the varied RF power pulse(s) and the positioning of the varied RF power pulse(s) at a beginning, end, or during another part of the etch process (collectively termed the varied RF power pulse schedule), can be specifically tailored to address (i.e. eliminate or substantially eliminate) undesired properties of an etched feature that would otherwise manifest themselves if using a conventional RF power schedule. For instance, the varied RF power pulse schedule can facilitate formation of trench sidewalls having desired properties, such as a substantially uniform slope.

Figure 8:
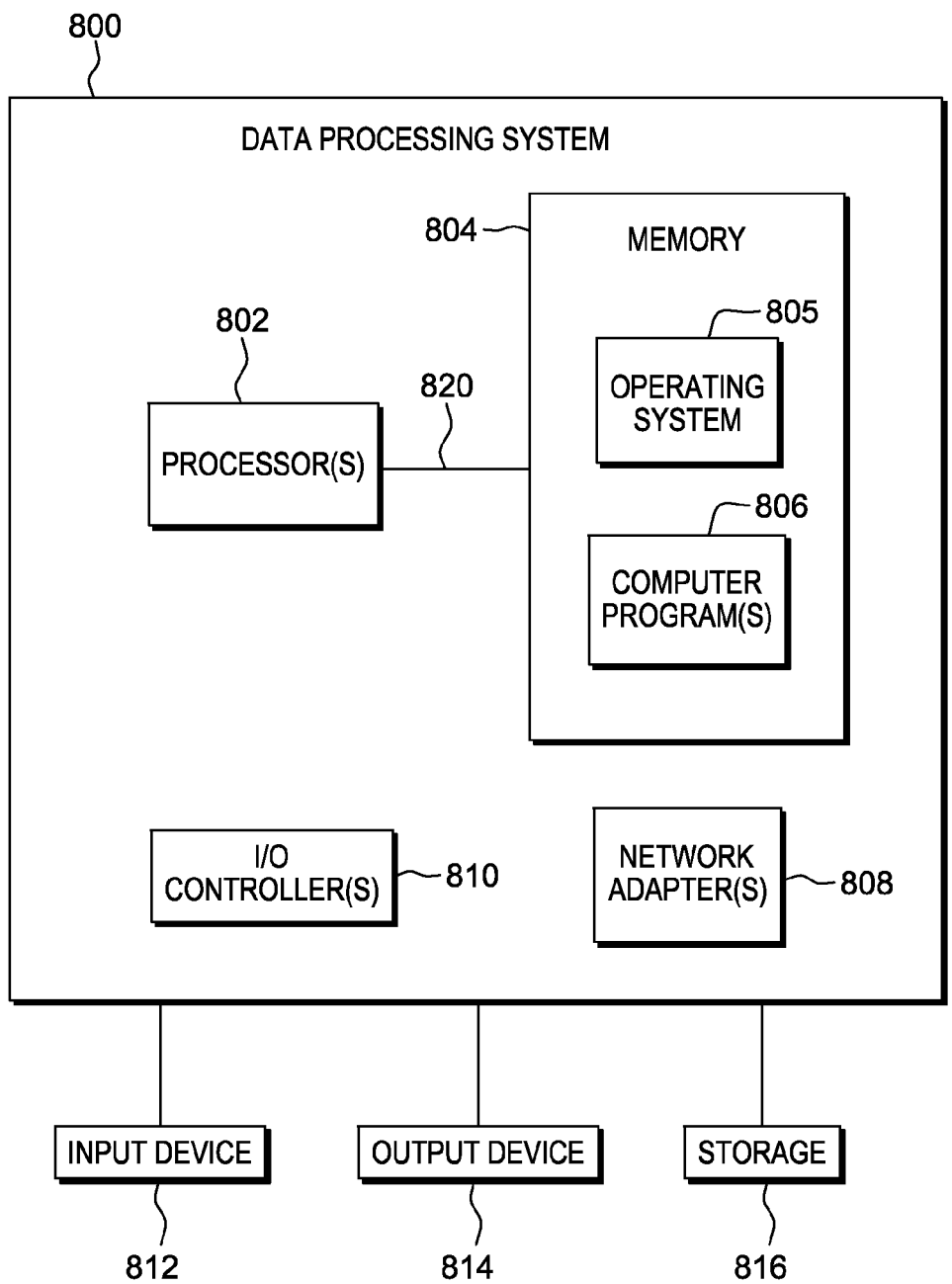
FIG. 8 depicts one example of a data processing system to incorporate and use aspects described herein.

FIG. 8 depicts one example of a data processing system to incorporate and use one or more aspects of the present invention. Data processing system 800 of FIG. 8 is suitable for storing and/or executing program code, such as program code for performing processes described above, such as varying supply of RF power pulses to an etch system, and includes at least one processor 802 coupled directly or indirectly to memory 804 through, a bus 820. In operation, processor(s) 802 obtain from memory 804 one or more instructions for execution by the processors. Memory 804 may include local memory employed during actual execution of the program code, bulk storage, and cache memories which provide temporary storage of at least some program code in order to reduce the number of times code must be retrieved from bulk storage during program code execution. A non-limiting list of examples of memory 804 includes a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. Memory 804 includes an operating system 805 and one or more computer programs 806, such as one or more programs for execution to perform aspects described herein, such as sending command(s) to a power supply to supply RF power pulses according to a schedule determined by the data processing system.

Input/Output (I/O) devices 812, 814 (such as peripheral devices) may be coupled to the system either directly or through I/O controllers 810.

Network adapters 808 may also be coupled to the system to enable the data processing system to become coupled to other data processing systems through intervening private or public networks. Modems, cable modem and Ethernet cards are just a few of the currently available types of network adapters 808. In one example, network adapters 808 facilitate obtaining data from remote sources to facilitate aspects of the present invention.

Data processing system 800 may be coupled to storage 816 (e.g., a non-volatile storage area, such as magnetic disk drives, optical disk drives, a tape drive, etc.), having one or more databases. Storage 816 may include an internal storage device or an attached or network accessible storage. Computer programs in storage 816 may be loaded into memory 804 and executed by a processor 802.

The data processing system 800 may include fewer components than illustrated, additional components not illustrated herein, or some combination of the components illustrated and additional components. Data processing system 800 may include any computing device, such as a mainframe, server, personal computer, workstation, laptop, handheld computer, telephony device, network appliance, virtualization device, storage controller, etc.

In addition, processes described above may be performed by multiple data processing systems 800, working as part of a clustered computing environment.

In some embodiments, aspects of the present invention may take the form of a computer program product embodied in one or more computer readable medium(s). The one or more computer readable medium(s) may have embodied thereon computer readable program code. Various computer readable medium(s) or combinations thereof may be utilized. For instance, the computer readable medium(s) may include a computer readable storage medium, examples of which include (but are not limited to) one or more electronic, magnetic, optical, or semiconductor systems, apparatuses, or devices, or any suitable combination of the foregoing. Example computer readable storage medium(s) include, for instance: an electrical connection having one or more wires, a portable computer diskette, a hard disk or mass-storage device, a random access memory (RAM), read-only memory (ROM), and/or erasable-programmable read-only memory such as EPROM or Flash memory, an optical fiber, a portable compact disc read-only memory (CD-ROM), an optical storage device, a magnetic storage device (including a tape device), or any suitable combination of the above. A computer readable storage medium is defined to include a tangible medium that can contain or store program code for use by or in connection with an instruction execution system, apparatus, or device, such as a processor. The program code stored in/on the computer readable medium therefore produces an article of manufacture (such as a "computer program product") including program code.

Figure 9:
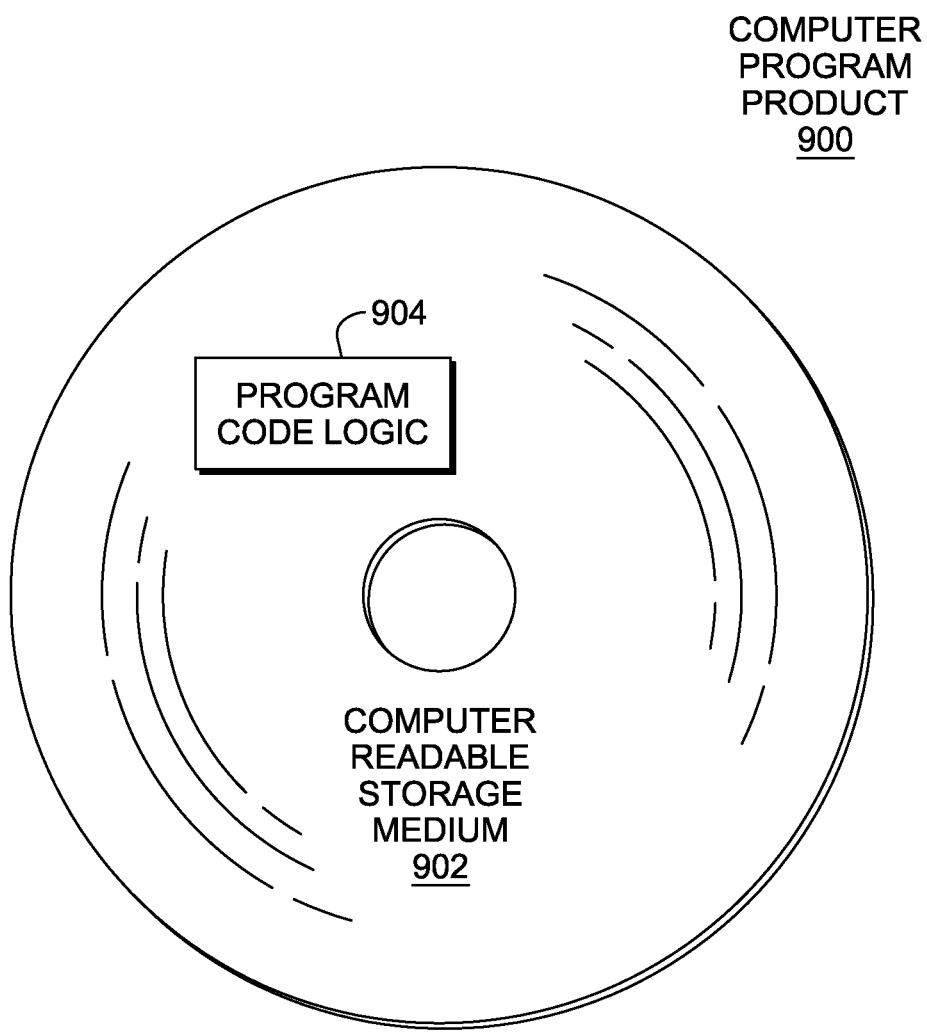
FIG. 9 depicts one embodiment of a computer program product incorporating aspects described herein.

Referring now to FIG. 9, in one example, a computer program product 900 includes, for instance, one or more computer readable media 902 to store computer readable program code means or logic 904 thereon to provide and facilitate one or more aspects of the present invention.

Program code contained or stored in/on a computer readable medium can be obtained and executed by a data processing system (computer, computer system, etc. including a component thereof) and/or other devices to cause the data processing system, component thereof, and/or other device to behave/function in a particular manner. The program code can be transmitted using any appropriate medium, including (but not limited to) wireless, wireline, optical fiber, and/or radio-frequency. Program code for carrying out operations to perform, achieve, or facilitate aspects of the present invention may be written in one or more programming languages. In some embodiments, the programming language(s) include object-oriented and/or procedural programming languages such as C, C++, C#, Java, etc. Program code may execute entirely on the user's computer, entirely remote from the user's computer, or a combination of partly on the user's computer and partly on a remote computer. In some embodiments, a user's computer and a remote computer are in communication via a network such as a local area network (LAN) or a wide area network (WAN), and/or via an external computer (for example, through the Internet using an Internet Service Provider).

In one example, program code includes one or more program instructions obtained for execution by one or more processors. Computer program instructions may be provided to one or more processors of, e.g., one or more data processing system, to produce a machine, such that the program instructions, when executed by the one or more processors, perform, achieve, or facilitate aspects of the present invention, such as actions or functions described in flowcharts and/or block diagrams described herein. Thus, each block, or combinations of blocks, of the flowchart illustrations and/or block diagrams depicted and described herein can be implemented, in some embodiments, by computer program instructions.

The flowcharts and block diagrams depicted and described with reference to the Figures illustrate the architecture, functionality, and operation of possible embodiments of systems, methods and/or computer program products according to aspects of the present invention. These flowchart illustrations and/or block diagrams could, therefore, be of methods, apparatuses (systems), and/or computer program products according to aspects of the present invention.

In some embodiments, as noted above, each block in a flowchart or block diagram may represent a module, segment, or portion of code, which includes one or more executable instructions for implementing the specified behaviors and/or logical functions of the block. Those having ordinary skill in the art will appreciate that behaviors/functions specified or performed by a block may occur in a different order than depicted and/or described, or may occur simultaneous to, or partially/wholly concurrent with, one or more other blocks. Two blocks shown in succession may, in fact, be executed substantially concurrently, or the blocks may sometimes be executed in the reverse order. Additionally, each block of the block diagrams and/or flowchart illustrations, and combinations of blocks in the block diagrams and/or flowchart illustrations, can be implemented wholly by special-purpose hardware-based systems, or in combination with computer instructions, that perform the behaviors/functions specified by a block or entire block diagram or flowchart.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
facilitating etching a feature of a structure by an etch system, the feature comprising varying widths including a first width and a second width, the first width being a narrower width than the second width, and the facilitating comprising:
varying supply of radio frequency (RF) power pulses in the form of a power wave to the structure, the varying providing at least one RF power pulse, of the supplied RF power pulses, that deviates from one or more other RF power pulses, of the supplied RF power pulses, by at least one characteristic, wherein the varying facilitates formation of the varying widths of the feature of the structure during the etching,
wherein the structure is positioned within a chamber of the etch system that includes a controlled volume of a first gas during the varying supply of RF power pulses.

2. The method of claim 1, wherein the at least one characteristic comprises peak power level, in which the at least one RF power pulse has a peak power level that is greater or lesser than a peak power level of the one or more other RF power pulses.

3. The method of claim 2, wherein varying the supply of RF power pulses comprises increasing peak power level across at least two consecutive RF power pulses of the supplied RF power pulses, wherein the increasing peak power level facilitates formation of the narrower width of the feature of the structure at a top portion of the structure.

4. The method of claim 2, wherein varying the supply of RF power pulses comprises decreasing peak power level across at least two consecutive RF power pulses of the supplied RF power pulses, wherein the decreasing peak power level facilitates formation of the narrower width of the feature of the structure at a bottom portion of the structure.

5. The method of claim 1, wherein the at least one characteristic comprises trough power level, in which the at least one RF power pulse has a trough power level that is greater or lesser than a trough power level of the one or more other RF power pulses.

6. The method of claim 1, wherein the at least one characteristic comprises tough power level and peak power level, wherein varying the supply of RF power pulses comprises increasing or decreasing trough power level across at least two consecutive RF power pulses of the supplied RF power pulses while increasing or decreasing peak power level across the at least two consecutive RF power pulses of the supplied RF power pulses.

7. The method of claim 1, wherein the at least one characteristic comprises power pulse duration, in which the at least one RF power pulse has a pulse duration that is longer or shorter than a pulse duration of the one or more other RF power pulses.

8. The method of claim 1, wherein the at least one characteristic comprises power pulse cycle time, in which a duration of time between an RF power pulse of the at least one RF power pulse and an RF power pulse following the RF power pulse of the at least one RF power pulse is longer or shorter than a duration of time between an RF power pulse of the one or more other RF power pulses and an RF power pulse following the RF power pulse of the one or more other RF power pulses.

9. The method of claim 1, wherein the at least one characteristic comprises:
power pulse duration, in which the at least one RF power pulse has a pulse duration that is longer or shorter than a pulse duration of the one or more other RF power pulses; and
at least one of: peak power level, in which the at least one RF power pulse has a peak power level that is greater or lesser than a peak power level of the one or more other RF power pulses, or trough power level, in which the at least one RF power pulse has a trough power level that is greater or lesser than a trough power level of the one or more other RF power pulses.

10. The method of claim 1, wherein the at least one characteristic comprises at least one of:
power pulse duration, in which the at least one RF power pulse has a pulse duration that is longer or shorter than a pulse duration of the one or more other RF power pulses;
peak power level, in which the at least one RF power pulse has a peak power level that is greater or lesser than a peak power level of the one or more other RF power pulses; or
trough power level, in which the at least one RF power pulse has a trough power level that is greater or lesser than a trough power level of the one or more other RF power pulses.

11. The method of claim 1, wherein the varying facilitates etching the feature to have substantially uniformly sloped sidewalls extending between the first and second widths.

12. The method of claim 1, wherein the first gas is sulfur hexafluoride.

13. The method of claim 1, wherein the power wave fluctuates between periods of high RF power and periods of low or no RF power.

14. The method of claim 13, wherein each power pulse comprises a first period of high RF power and a first period of low or no RF power immediately following the first period of high RF power.

15. The method of claim 13, wherein portions of the feature are etched during the periods of high RF power, and wherein portions of the feature passivate during the periods of low or no RF power.

16. A system comprising:
a controller to facilitate etching a feature of a structure by an etch system, the feature comprising varying widths including a first width and a second width, the first width being a narrower width than the second width, and the controller configured to:
vary a supply of radio frequency (RF) power pulses in the form of a power wave to the structure, the varying providing at least one RF power pulse, of the supplied RF power pulses, that deviates from one or more other RF power pulses, of the supplied RF power pulses, by at least one characteristic, wherein the varying facilitates formation of the varying widths of the feature of the structure during the etchings
wherein the structure is positioned within a chamber of the etch system that includes a first gas during the varying supply of RF power pulses.

17. The system of claim 16, wherein the at least one characteristic comprises at least one of:
peak power level, in which the at least one RF power pulse has a peak power level that is greater or lesser than a peak power level of the one or more other RF power pulses; or
trough power level, in which the at least one RF power pulse has a trough power level that is greater or lesser than a trough power level of the one or more other RF power pulses.

18. The system of claim 16, wherein the at least one characteristic comprises at least one of:
power pulse duration, in which the at least one RF power pulse has a pulse duration that is longer or shorter than a pulse duration of the one or more other RF power pulses; or
power pulse cycle time, in which a duration of time between an RF power pulse of the at least one RF power pulse and an RF power pulse following the RF power pulse of the at least one RF power pulse is longer or shorter than a duration of time between an RF power pulse of the one or more other RF power pulses and an RF power pulse following the RF power pulse of the one or more other RF power pulses.

19. A computer program product comprising:
a non-transitory computer readable storage medium storing program instructions readable by a processor for execution to perform a method comprising:
facilitating etching a feature of a structure by an etch system, the feature comprising varying widths including a first width and a second width, the first width being a narrower width than the second width, and the facilitating comprising:
varying supply of radio frequency (RF) power pulses in the form of a power wave to the structure, the varying providing at least one RF power pulse, of the supplied RF power pulses, that deviates from one or more other RF power pulses, of the supplied RF power pulses, by at least one characteristic, wherein the varying facilitates formation of the varying widths of the feature of the structure during the etching,
wherein the structure is positioned within a chamber of the etch system that includes a first gas during the varying supply of RF power pulses.

20. The computer program product of claim 19, wherein the at least one characteristic comprises at least one of:
peak power level, in which the at least one RF power pulse has a peak power level that is greater or lesser than a peak power level of the one or more other RF power pulses;
trough power level, in which the at least one RF power pulse has a trough power level that is greater or lesser than a trough power level of the one or more other RF power pulses;
power pulse duration, in which the at least one RF power pulse has a pulse duration that is longer or shorter than a pulse duration of the one or more other RF power pulses; or
power pulse cycle time, in which a duration of time between an RF power pulse of the at least one RF power pulse and an RF power pulse following the RF power pulse of the at least one RF power pulse is longer or shorter than a duration of time between an RF power pulse of the one or more other RF power pulses and an RF power pulse following the RF power pulse of the one or more other RF power pulses.

* * * * *